US005183530A

United States Patent [19]

Yamazaki

[11] Patent Number: 5,183,530

[45] Date of Patent: Feb. 2, 1993

[54] METHOD OF MANUFACTURING DIAMOND THERMISTORS

[75] Inventor: Shunpei Yamazaki, Tokyo, Japan

[73] Assignee: Semiconductor Energy Laboratory Co., Ltd., Kanagawa, Japan

[21] Appl. No.: 579,536

[22] Filed: Sep. 10, 1990

[30] Foreign Application Priority Data

Sep. 11, 1989 [JP] Japan .................................. 1-235139

[51] Int. Cl.[5] .............................................. H01L 21/00

[52] U.S. Cl. .................................... 156/643; 156/646; 156/656; 437/181; 437/189; 437/918; 338/22 R; 338/225 D

[58] Field of Search ........................ 156/643, 646, 656; 338/22 R, 22 SD; 29/612; 437/181, 189, 918

[56] References Cited

U.S. PATENT DOCUMENTS 4,806,900 2/1989 Fujimori et al. .................. 338/22 R
4,886,571 12/1989 Suzuki et al. ........................ 156/646
4,957,591 9/1990 Sato et al. ........................... 156/643

*Primary Examiner*—Thi Dang
*Attorney, Agent, or Firm*—Sixbey, Friedman, Leedom & Ferguson

[57] ABSTRACT

A method of manufacturing diamond thermistors is described. A pair of diamond contact regions having a low resistance are formed on a temperature sensing diamond substrate. The formation of the diamond contact regions is carried out by depositing a diamond film using a carbon compound gas and a dopant gas and etching the diamond film to leave the contact regions by an etchant comprising fluorine or oxygen.

18 Claims, 5 Drawing Sheets

METHOD OF MANUFACTURING DIAMOND THERMISTORS

BACKGROUND OF THE INVENTION

1. Field of the Invention

The present invention relates to a method of manufacturing diamond devices, and more particularly to a method of manufacturing thermistors having high temperature coefficients utilizing diamond films deposited by vapor phase reaction.

2. Description of the Prior Art

There have been two types of thermistors, i.e. PTC (positive temperature coefficient) devices and NTC (negative temperature coefficient) devices. The former are made of barium titanate and the later of silicon carbide for example. The temperature range in which these conventional devices can operate is not so wide and their response speed to temperature change is not so high.

On the other hand, electric devices utilizing diamond have recently attracted reseacher's interest. Some attempts have been made to form thermistors by the use of diamond film as a thermally sensitive area. The prior art diamond thermistors have only small thermistor coefficients and require relatively high voltages to be applied thereacross. The inventor carefully investigated the thermal characteristics of the prior art thermistors. The thermistor coefficients thereof were measured to be as large as about 7000 (activation energy=0.6V) when the diamond was not given intentional doping such as boron. The resistance at the contact between the diamond and an electrode, however, was very high. Because of this, it was very difficult to control the distance between electrodes so that a relatively high voltage is needed as a bias voltage to drive the prior art device and therefore the characteristics of devices were substantially dispersed.

By introducing boron ions into the diamond, good ohmic low resistant contacts can be obtained. The thermistor coefficient of the device, however, is decreased to be about 2000 (activation energy=0.21 eV) in case of 300 ppm doping of boron. Therefore, a need exists for diamond thermistors for forming good ohmic contacts without sacrifice of the thermistor coefficient.

SUMMARY OF THE INVENTION

It is a principal object of the present invention to provide a method of producing a diamond thermistor consisting of a temperature sensing diamond film having a high thermistor coefficient and low contact resistance at its terminals.

Additional objects, advantages and novel features of the present invention will be set forth in the description which follows, and in part will become apparent to those skilled in the art upon examination of the following or may be learned by practice of the present invention. The object and advantages of the invention may be realized and attained by means of the instrumentalities and combinations particularly pointed out in the appended claims.

In order to accomplish the foregoing and other objects and advantages, it is proposed to form contact regions having low resistivity in order to make good electric contact with electrodes. The contact regions are formed by depositing an impurity diamond film (p-type or n-type semiconductor film) on a temperature sensing diamond film (intrinsic semiconductor having a high thermistor coefficient) and etching the impurity diamond film with a mask leaving portions corresponding to the contact regions on which electrodes are deposited to form the output terminals of the thermistor. Diamond can be etched easily with a plasma etchant comprising oxygen or fluorine. With this structure, the sensitivity and response speed to temperature change are significantly improved. Namely, only the transition time of 3 seconds or shorter is required for the thermistors according to the present invention to change from one condition at a first temperature to another condition at a second temperature following temperature change. Also, 6000 or higher thermistor coefficients are achieved.

BRIEF DESCRIPTION OF THE DRAWINGS

The accompanying drawings, which are incorporated in and form a part of the invention and, together with the description, serve to explain the principles of the invention.

DETAILED DESCRIPTION OF THE PREFERRED EMBODIMENTS

Figure 1A:
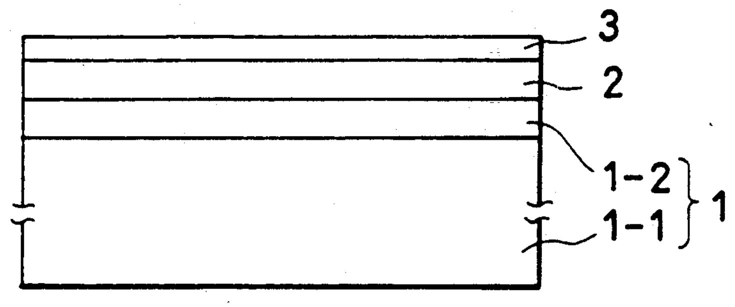
FIGS. 1(A) to 1(C) are cross sectional views showing a method of manufacturing diamond thermistors in accordance with a first embodiment of the present invention.
Figure 1B:
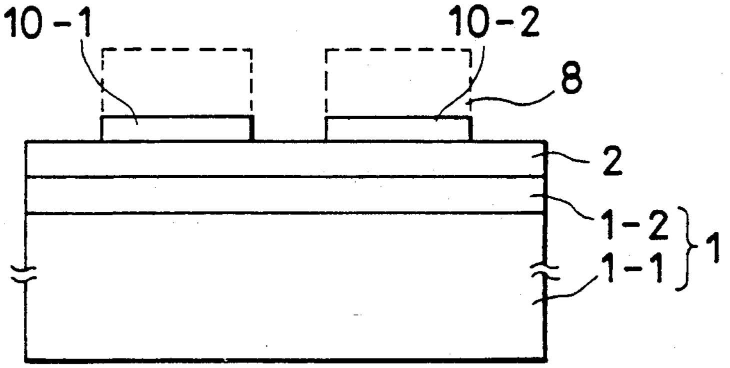
Figure 1C:
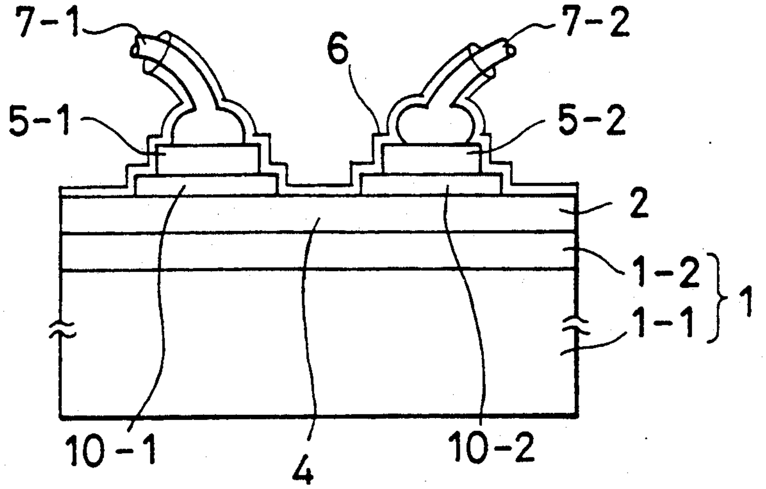

FIGS. 1(A) to 1(C) show elevational views, in cross section, of the successive steps of manufacture of a diamond thermistor in accordance with a first embodiment of the present invention.

A silicon nitride film 1-2 of 0.3 micrometer thickness is deposited on a single crystalline silicon semiconductor substrate 1-1 by a known CVD method to form an appropriate substrate for thermistor. The melting point of the silicon nitride film is 1700° C. and therefore the interaction between the silicon substrate and a diamond film to be deposited thereon in the following process is effectively avoided. On the silicon nitride film 1-2 a diamond film 2 is deposited to an average thickness of 1.3 micrometers as a substantially intrinsic semiconductor film as shown in FIG. 1(A) by chemical vapor deposition. The diamond film 2 may be doped, if desired, with boron at a limited density of no higher than $1\times10^{17}$ $cm^{-3}$ or with Zn, P, N, As, S, O, Se or the like at $1\times10^{15}$ to $1\times10^{17}$ $cm^{-3}$.

On the diamond film 2, another diamond film 3, which is a semiconductor having a p-type conductivity, is deposited to a thickness of 0.5 micrometers by chemical vapor deposition in the same manner. The deposition, in this case, is carried out using a dopant gas comprising boron to make the diamond deposited a p-type semiconductor. The deposition process of the diamond film 2 and 3 is carried out in an apparatus illustrated in FIG. 2, which will be explained later in details.

A photoresist film 8 of 0.3 micrometer thickness is coated on the diamond film 3 and patterned to cover selected portions of the surface thereof. With the photoresist film 8 as a mask, the diamond film 3 is selectively removed by plasma etching utilizing $NF_3$ as an etchant to form p-type contact regions 10-1 and 10-2. The etching process is carried out in an etching apparatus of a parallel plate type having an electrode area of 30 cmϕ at 0.1 Torr. The etching energy is supplied at 400 W in the form of high frequency electric current at 13.56 MHz. A silicon nitride film may be interposed as a protecting film, if necessary, between the diamond film 3 and the photoresist film 8.

A pair of electrodes 5-1 and 5-2 are formed on the p-type regions 10-1 and 10-2 by vapor evaporation or sputtering. The electrodes are made of a dual film consisting of a lower titanium or tungsten film and an upper aluminum film with which wire bonding can be made easily. Lead wirings 7-1 and 7-2 are bonded to the electrodes 5-1 and 5-2. Finally, a silicon nitride film 6 is coated to a thickness of 500 to 5000 angstroms on the whole surface of the structure as an antireflection and passivation film. Then, the formation of a planar thermistor has been completed with an elec-tric current path consisting of the electrode 5-1, the impurity semiconductor region 10-1 of a p-type conductivity, the tempera-ture sensing region 4 of substantially intrinsic semiconductor, the other p-type semiconductor region 10-2 and the other electrode 5-2. Such a planar thermistor is particularly suitable to detect temperature change of liquids or gases.

Figure 3:
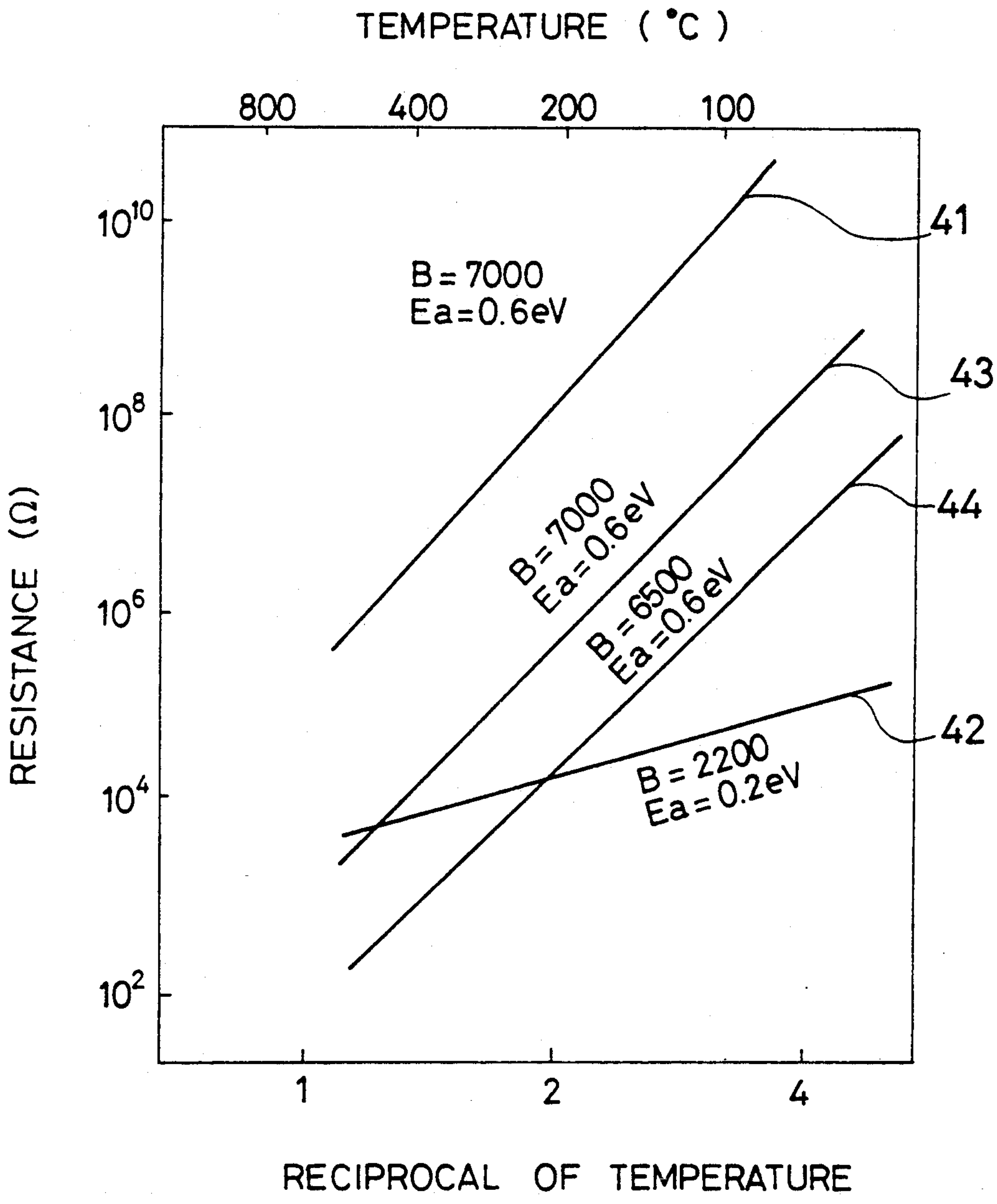
FIG. 3 is a graphical representation showing temperature-resistance characteristics of thermistors.

FIG. 3 illustrates the resistances of thermistors as functions of the reciprocal of temperature. Line 41 represents the characteristic of a thermistor formed in accordance with the above process but with no intentional dose of any impurity into the temperature sensing diamond film 2. The distance between the pair of electrodes 5-1 and 5-2 was 0.5 mm. The thermistor constant was measured to be 7000 and the activation energy to be 0.6 eV. The voltage applied between the electrodes was relatively high as 70 to 250 V because of the relatively wide distance. Line 42 represents the resistance of a thermistor formed according to the above process with intentional doping of boron ions at 300 ppm into the whole diamond film 2 including the temperature sensing diamond region 4. While the good ohmic contacts were made at the electrodes 5-1 and 5-2, the thermistor constant was so small as 2200. Lines 43 and 44 represent the resistances of thermistors formed in accordance with the above process in which no intentional dose of any impurity was introduced into the temperature sensing diamond region 3 while the contact regions 10-1 and 10-2 is doped. The measurement was carried out by applying an voltage of 5 to 30 V, e.g. 20 V. The distance between the pair of electrodes 5-1 and 5-2 was chosen 0.3 mm and 0.1 mm. The thermistor constant was measured to be 7000 and 6500 and the activation energies to be 0.6 eV respectively. These thermistors were operative only with voltage application of 10 V and 5 V.

Figure 2:
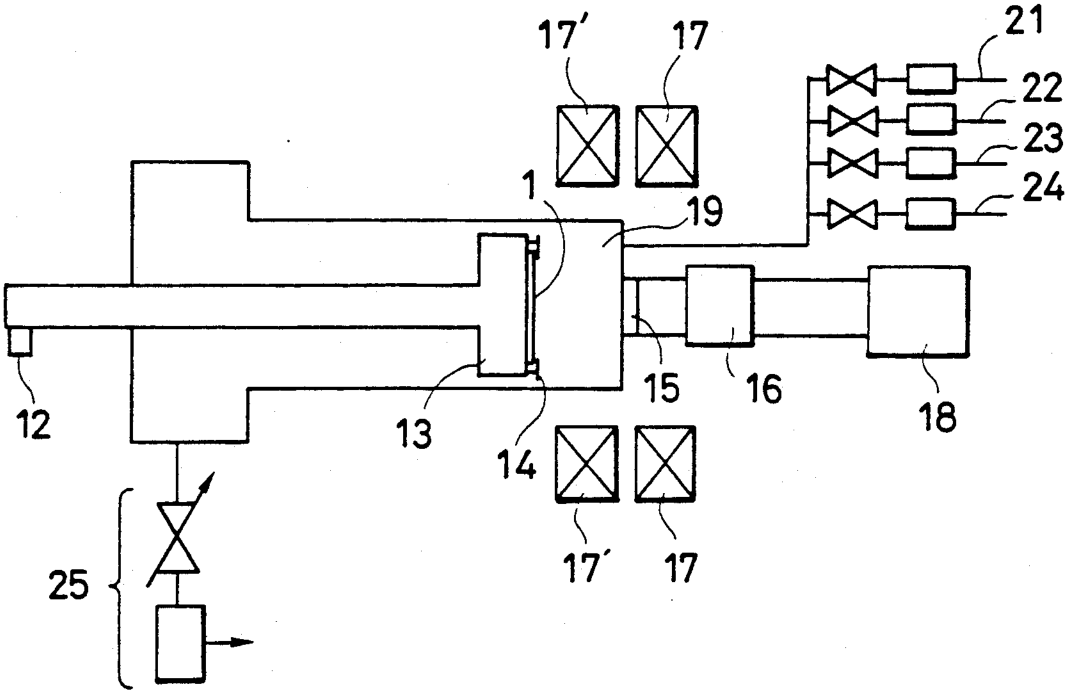
FIG. 2 is a cross sectional view showing a CVD apparatus for use in depositing diamond films as a process of the method in accordance with the present invention.

Then, description of the method of depositing the diamond films 2 and 3 is in order. Referring to FIG. 2, a microwave-assisted CVD apparatus provided with associated Helmholtz coils 17 and 17' for use in depositing diamond films is shown. The apparatus comprises a vacuum chamber defining a deposition space 19 therein, a microwave generator 18 connected to the chamber through an attenuater 16 and a quartz window 15, a gas introduction system having four inlet ports 21 to 24, a gas evacuation system 25 coupled with the chamber through a pressure controlling valve and a substrate holder 13 provided in the chamber with a substrate position adjusting mechanism 12 for supporting a substrate 1 at an appropriate position. By the use of the adjusting mechanism 12, the axial position of the holder can be adjusted in order to change the volume of the reactive space 19. The evacuation system functions both as a pressure controller and as a stop valve. The pressure in the chamber is adjusted by means of the valve. The inside of the chamber and the holder 13 are circular and coaxial with each other. The procedure of depositing diamond films in the apparatus is as follow.

The substrate 1 is mounted on the holder 13. The surface of the substrate 1 is preferably given scratches in advance which form focuses for crystalline growth. The scratches are formed for example by putting the substrate in a liquid in which diamond fine particles are dispersed and applying ultrasonic waves thereto for 1 minute to 1 hour. After fixing the substrate 1 on the holder 13 with a keeper 14, the pressure in the reaction space 19 is reduced to $10^{-3}$ to $10^{-6}$ Torr by means of the evacuation system 25 followed by introduction of a reactive gas to a pressure of 0.01 to 3 Torr, typically 0.1 to 1 Torr, e.g. 0.26 Torr. The reactive gas comprises —OH bonds, e.g. an alcohol such as methyl alcohol ($CH_3OH$) or ethyl alcohol ($C_2H_5OH$) diluted with hydrogen at a volume ratio of alcohol/hydrogen=0.4 to 2, e.g. 0.7. The hydrogen is introduced through the port 22 at 100 SCCM and the alcohol through the port 21 at 70 SCCM for example. For the deposition of the diamond film 3, a dopant gas of $B(CH_3)_3$ have to be additionally introduced at a volume ratio of $B(CH_3)_3/CH_3OH=0.0001$ to 0.03 to deposit a p-type semiconductor material of diamond. The coils are energized during the deposition to induce a magnetic field having a maximum strength of 2.2 K Gauss and a resonating strength of 875 Gauss at the surface of the substrate 1 to be coated. Then, microwaves are applied at 1 to 5 GHz, e.g. 2.45 GHz up to 10 KW, e.g. 5 KW in the direction parallel to the direction of the magnetic field to cause ionized particles of the reactive gas in the form of plasma to resonate therewith in the magnetic field. As a result, a polycrystalline film of diamond grows on the substrate. 2 hour deposition for example can form a diamond film of 0.5 to 5 micrometers thickness, e.g. 1.3 micrometers thickness. During the deposition of diamond film, carbon graphite is also deposited. However, the graphite comprising $sp^2$ bonds, which is relatively chemically unstable as compared with diamond comprising $sp^3$ bonds, reacts with radicals which also occur in the plasma of the alcohol and is removed from the deposited film. The temperature of the substrate 1 is elevated to 200° C. to 1000° C., typically 300° C. to 900° C., e.g. 800° C. by microwaves. If the substrate temperature is too elevated, water cooling is effected to the substrate holder 13. If the substrate temperature is too low, the substrate is heated from the holder side by means of a heating means (not shown).

Figure 4:
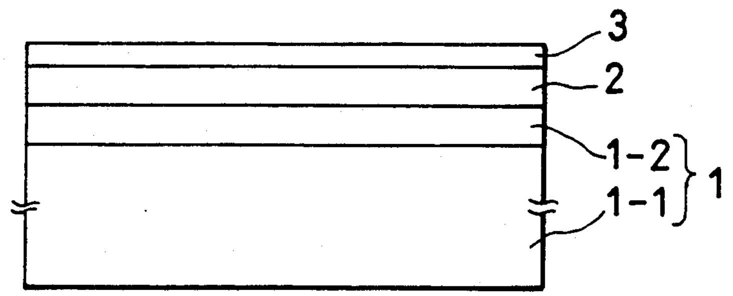
FIGS. 4(A) to 4(C) are cross sectional views showing a method of manufacturing diamond thermistors in accordance with a second embodiment of the present invention.
Figure 4:
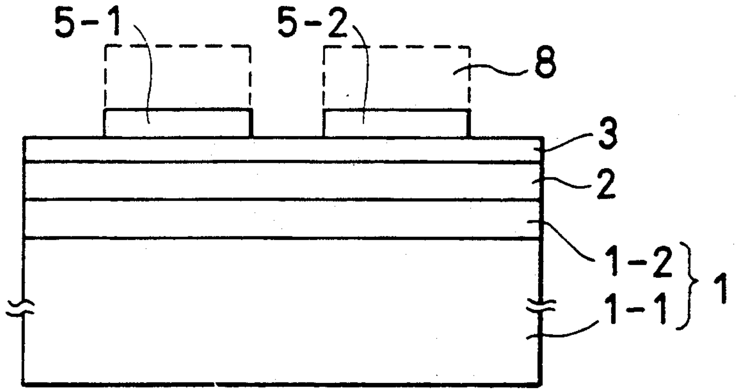
Figure 4:
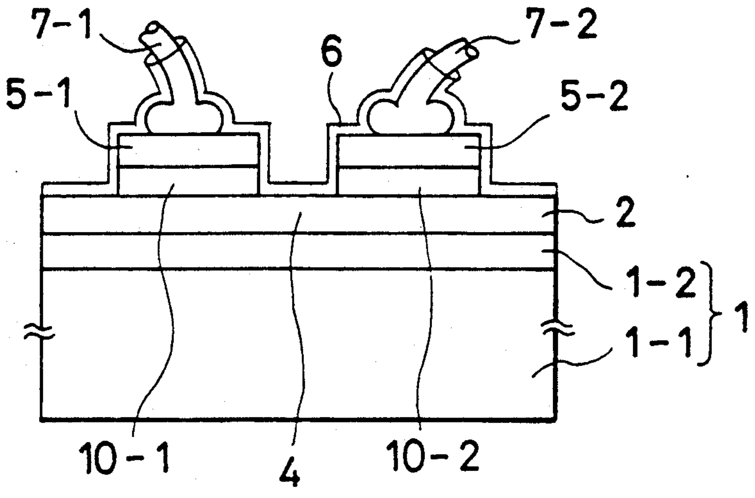

FIGS. 4(A) to 4(C) show elevational views, in cross section, of the successive steps of manufacture of a diamond thermistor in accordance with a second embodiment of the present invention.

A silicon nitride film 1-2 of 0.3 micrometer thickness, an intrinsic diamond film 2 and a p-type impurity diamond film 3 are deposited on a single crystalline silicon semiconductor substrate in the same manner as the first embodiment as shown in FIG. 4(A).

The upper surface of the diamond film 3 is coated with a conductive dual layer consisting of a titanium film and a gold film. The conductive layer is patterned by etching with a strong acid as an etchant through a photoresist mask 8 in order to form a pair of electrodes 5-1 and 5-2. The p-type diamond film 3 is then removed except for just below the electrodes 5-1 and 5-2 by plasma etching utilizing oxygen as an etchant. While the upper film of the electrodes 5-1 and 5-2 made from gold resists oxygen etching action and functions as a mask, the p-type diamond film is selectively removed as carbon oxide together with the photoresist 8. Finally, a silicon nitride film 6 is coated to a thickness of 500 to 5000 angstroms on the whole surface of the structure for antireflection and passivation. Then, the formation of a planar thermistor has been completed. The number of the photoresist mask is reduced in accordance with this embodiment as compared with the first embodiment. In accordance with experiments, the thermistor manufactured by this process was operable when a bias voltage of 10 V was applied between the electrodes and the thermistor coefficient thereof was measured to be about 6000.

Figure 5A:
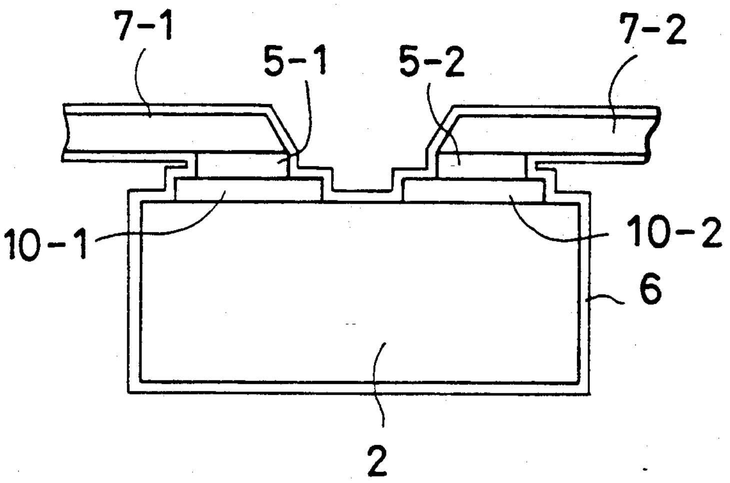
FIGS. 5(A) and 5(B) are cross sectional views showing diamond thermistors in accordance with third and fourth embodiments of the present invention.

Referring now to FIG. 5(A), a thermistor in accordance with a third embodiment of the present invention is illustrated in cross section. A single crystalline diamond plate 2 is employed as the substrate. A pair of impurity regions 10-1 and 10-2 are formed by chemical vapor deposition and etching in the same manner as the first embodiment. A pair of titanium electrodes 5-1 and 5-2 are formed on the impurity regions 10-1 and 10-2. Connection of leads 7-1 and 7-2 is made by welding. The structure is coated with a silicon nitride film 6 in the same manner. The production cost of this embodiment will be much higher than that of the first embodiment. The response speed, however, is expected to be very high because heat can be rapidly transported and dissipated through the substrate in this case.

Figure 5B:
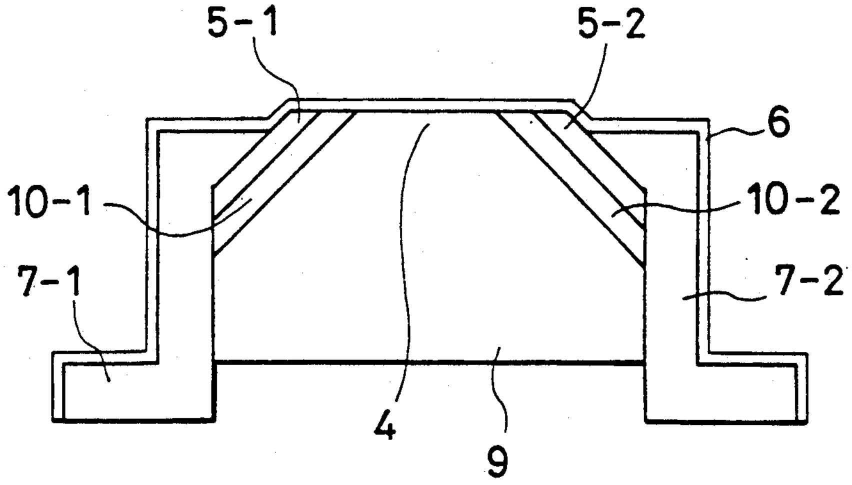

Referring now to FIG. 5(B), a non-planar thermistor in accordance with a fourth embodiment of the present invention is illustrated in cross section. An impurity diamond film is deposited on a sloped plateau of intrinsic diamond 9. A titanium film is further deposited on the impurity diamond film. The upper portion of the plateau is then cut off by grinding as illustrated in FIG. 5(B) in order to form impurity region 10-1 and 10-2 and a pair of titanium electrodes 5-1 and 5-2. Between the impurity regions 10-1 and 10-2 is a temperature sensing region 4. A pair of leads 7-1 and 7-2 are formed on the electrodes 5-1 and 5-2 in order that the upper surfaces of the leads and the electrodes do not exceed the upper surface of the sensing region 4. The structure is coated with a silicon nitride film 6 in the same manner. The thermistor of this type is convenient when used in contact temperature sensors.

The foregoing description of preferred embodiments has been presented for purposes of illustration and description. It is not intended to be exhaustive or to limit the invention to the precise form described, and obviously many modifications and variations are possible in light of the above teaching. The embodiment was chosen in order to explain most clearly the principles of the invention and its practical application thereby to enable others in the art to utilize most effectively the invention in various embodiments and with various modifications as are suited to the particular use contemplated. For example, the temperature sensing diamond region may be doped with an impurity which is selected from Groups IIb, IVa and VIa of the periodic table (which is found in DICTIONARY OF SCIENCE printed by Richard Clay Ltd.) but different than that used for the contact diamond regions.

The present invention is broadly applicable for combination usage with other electric devices comprising diamond. These electric devices can be formed on a single substrate, i.e. an integrated circuit device which may consists of diamond light emitting devices, diamond diodes, diamond transistors, diamond resistances, diamond capacitors and the like. When a silicon semiconductor substrate in which several semiconductor devices are formed is used as a substrate on which diamond devices are formed, there can be formed an integrated circuit comprising silicon semiconductor devices and diamond devices. Of course, it is possible to sever a single substrate, after a number of diamond devices are formed on the substrate, into individual separate devices.

What is claimed is:

1. A method of manufacturing thermistors comprising:

forming an impurity diamond film on a temperature sensing diamond substrate;

selectively removing said impurity diamond film in order to leave a pair of contact regions; and forming a pair of electrodes respectively on the pair of said contact regions.

2. The method of claim 1 wherein said removing step is performed by plasma etching.

3. The method of claim 2 wherein said plasma etching is performed with a plasma etchant comprising an element selected from the group consisting of fluorine and oxygen.

4. The method of claim 3 wherein said plasma etchant is formed from $NF_3$.

5. The method of claim 1 wherein said diamond substrate is formed by depositing a diamond film having a substantially intrinsic type conductivity on a substrate.

6. The method of claim 5 wherein said substrate is a single crystalline diamond.

7. The method of claim 1 wherein said impurity diamond film is formed on a plateau of said diamond substrate.

8. The method of claim 1 wherein said impurity diamond film is formed by depositing a diamond film by chemical vapor deposition using a dopant gas.

9. The method of claim 8 wherein said dopant gas comprises boron.

10. The method of claim 1 wherein said diamond substrate is doped with an impurity selected from Groups IIb, IVa and VIa of the periodic table.

11. A method of manufacturing thermistors comprising:

forming an impurity diamond film on a temperature sensing diamond substrate;

forming a pair of electrodes on said impurity diamond film; and selectively removing said impurity diamond film in order to leave a pair of contact regions by etching with said electrodes as a mask.

12. The method of claim 11 wherein said removing step is performed by plasma etching.

13. The method of claim 12 wherein said plasma etching is performed with a plasma etchant comprising oxygen.

14. The method of claim 13 wherein said plasma etchant is formed from $O_2$.

15. The method of claim 11 wherein said diamond substrate is formed by depositing a diamond film using an alcohol but no dopant gas on an underlying substrate.

16. The method of claim 15 wherein said underlying substrate is a single crystalline silicon semiconductor substrate.

17. The method of claim 11 wherein said impurity diamond film is formed by depositing a diamond film by chemical vapor deposition using a carbon compound gas together with a dopant gas.

18. The method of claim 17 wherein said dopant gas is $B(CH_3)_3$.

* * * * *